US011507875B2

(12) United States Patent
Bauer et al.

(10) Patent No.: US 11,507,875 B2
(45) Date of Patent: Nov. 22, 2022

(54) MEASUREMENT-ONLY MAJORANA-BASED SURFACE CODE ARCHITECTURE

(71) Applicant: Microsoft Technology Licensing, LLC, Redmond, WA (US)

(72) Inventors: Roman Bela Bauer, Santa Barbara, CA (US); Parsa Bonderson, Santa Barbara, CA (US); Alan D Tran, Goleta, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 158 days.

(21) Appl. No.: 16/917,511

(22) Filed: Jun. 30, 2020

(65) Prior Publication Data

US 2021/0279627 A1    Sep. 9, 2021

Related U.S. Application Data

(60) Provisional application No. 62/984,450, filed on Mar. 3, 2020, provisional application No. 62/983,822, filed on Mar. 2, 2020.

(51) Int. Cl.
*G06N 10/70* (2022.01)
*G06N 10/00* (2022.01)
*H03M 13/00* (2006.01)
*H03M 13/11* (2006.01)

(52) U.S. Cl.
CPC ............. *G06N 10/70* (2022.01); *G06N 10/00* (2019.01); *H03M 13/11* (2013.01); *H03M 13/63* (2013.01)

(58) Field of Classification Search
CPC .............................. G06N 10/70; G06N 10/00
See application file for complete search history.

(56) References Cited

U.S. PATENT DOCUMENTS

| | | | |
|---|---|---|---|
| 10,346,348 B2 | 7/2019 | Hastings et al. | |
| 10,490,600 B2 | 11/2019 | Freedman et al. | |
| 2018/0269906 A1* | 9/2018 | Haah | H03M 13/2909 |
| 2021/0011771 A1 | 1/2021 | Bonderson et al. | |

OTHER PUBLICATIONS

T. Hyart, B. van Heck, I. C. Fulga, M. Burrello, A. R. Akhmerov, and C. W. J. Beenakker; Flux-controlled quantum computation with Majorana fermions; https://arxiv.org/pdf/1303.4379.pdf; Jul. 29, 2013 (Year: 2013).*

Daniel Litinski and Felix von Oppen; Quantum Computing with Majorana Fermion Codes;https://www.physik.fu-berlin.de/en/einrichtungen/ag/ag-von-oppen/papers/1801_08143.pdf; Jan. 24, 2018 (Year: 2018).*

Jason Alicea; New directions in the pursuit of Majorana fermions in solid state systems; http://physics.gu.se/~tfkhj/TOPO/AliceaReview.pdf; Feb. 6, 2012 (Year: 2012).*

(Continued)

*Primary Examiner* — Joseph D Torres
(74) *Attorney, Agent, or Firm* — Holzer Patel Drennan

(57) ABSTRACT

A quantum device includes a syndrome measurement circuit that implements an correction code using a plurality of Majorana qubit islands. The syndrome measurement circuit is adapted to effect a syndrome measurement by performing a sequence of measurement-only operations, where each one of the measurement-only operations involves at most two of the Majorana qubit islands.

19 Claims, 5 Drawing Sheets

(56) References Cited

OTHER PUBLICATIONS

Christina Knapp, Michael Beverland, Dmitry I. Pikulin, and Torsten Karzig; Modeling noise and error correction for Majorana-based quantum computing; https://quantum-journal.org/wp-content/uploads/2018/08/q-2018-08-27-88.pdf; Aug. 24, 2018 (Year: 2018).*

Litinski, et al., "Quantum Computing with Majorana Fermion Codes", In Journal of Physical Review B, vol. 97, Issue 20, May 2, 2018, 30 Pages.

"International Search Report & Written Opinion Issued in PCT Application No. PCT/US2021/014188", dated May 12, 2021, 28 Pages.

Tran, Alan D., "Optimizing and Characterizing Measurement-only Topological Quantum Computing with Majorana Zero Mode Based Qubits", In a Dissertation Submitted in Partial Satisfaction of the Requirements for the Degree Doctor of Philosophy in Physics, Sep. 1, 2020, 206 Pages.

Bombin, et al., "Quantum measurements and gates by code deformation", In Journal of Physics A: Mathematical and Theoretical, vol. 42, Issue 9, Feb. 4, 2009, 19 Pages.

Bravyi, et al., "Majorana fermion codes", In New Journal of Physics, vol. 12, Issue 8, Aug. 17, 2010, 23 Pages.

Dennis, et al., "Topological Quantum Memory", In Journal of Mathematical Physics, vol. 43, Issue 9, Sep. 2002, pp. 4452-4505.

Hastings, et al., "Small majorana fermion codes", In Journal of Quantum Information & Computation, vol. 17, Nos. 13&14, Nov. 2017, pp. 1-11.

Karzig, et al., "Scalable designs for quasiparticle-poisoning-protected topological quantum computation with Majorana zero modes", In Journal of Physical Review B, vol. 95, No. 23, Jun. 1, 2017, 34 Pages.

Plugge, et al., "Roadmap to Majorana surface codes", In Journal of Physical Review, vol. 94, Issue 17, Jun. 2016, pp. 1-23.

Tran, et al., "Optimizing Clifford gate generation for measurement-only topological quantum computation with Majorana zero modes", In Repository of arXiv:1909.03002v1, Sep. 9, 2019, pp. 1-63.

* cited by examiner

MEASUREMENT-ONLY MAJORANA-BASED SURFACE CODE ARCHITECTURE

CROSS-REFERENCE TO RELATED APPLICATIONS

This application claims benefit of priority to U.S. Provisional Patent Application No. 62/983,822, entitled "MEASUREMENT-ONLY MAJORANA-BASED SURFACE CODE ARCHITECTURE" and filed on Mar. 2, 2020, and U.S. Provisional Patent Application No. 62/984,450, entitled "MEASUREMENT-ONLY MAJORANA-BASED SURFACE CODE ARCHITECTURE" and filed on Mar. 3, 2020 which are specifically incorporated by reference for all that they disclose or teach.

BACKGROUND

A *Majorana fermion* is a fermion that is its own antiparticle. Zero modes of *Majorana fermions* may be localized on defects, such as domain boundaries or vortices. Such Majorana zero modes (MZMs) are of interest to quantum computing because they may host nonlocal, topologically protected state spaces. Several recent experiments have demonstrated that MZMs can exist at the ends of one-dimensional semiconducting wires that are attached to a superconductor. MZMs are currently being explored as potential building blocks of qubits usable to perform topological quantum computations.

One approach to topological quantum computation using MZMs leverages a scheme in which MZMs are moved around relative to one other, and the movements create sequences of transformations on their nonlocal state spaces (referred to as "braiding exchanges" or "braiding transformations") that may be representative of corresponding computational gates acting on qubit states encoded in these state spaces. For example, in a particular encoding scheme, moving one quasiparticle clockwise around another could correspond to the NOT gate (Pauli X) acting on a qubit. To read out the qubit, the pair of quasiparticles may be forced to collide together on a nanowire such that the outcome may be measured. It has been shown that braiding transformations of MZMs may be used to generate the Clifford gate set acting on a system of qubits.

Another approach to topological quantum computation using MZMs leverages an anyonic analog of quantum state teleportation to create braiding transformations without physically transporting the MZMs around one another. This particular approach represents one example of "Measurement-only Topological Quantum Computation." In this approach, quantum state teleportation is realized by way of a projective measurements of the joint fermionic parity of pairs of MZMs together with the use of ancillary MZMs. Repeated application of quantum state teleportation may have the same effect as a braiding exchange of two MZMs in the above-described approach in which MZMs are physically moved around. Thus, MZM measurement sequences are performed to implement the Clifford quantum gate set. The herein-disclosed technology pertains to this latter approach.

SUMMARY

According to one implementation, a quantum device includes a syndrome measurement circuit that implements an error correction code using a plurality of Majorana qubit islands. The syndrome measurement circuit is adapted to effect a syndrome measurement by performing a sequence of measurement-only operations, each one of the measurement-only operations involving at most two of the Majorana qubit islands.

DETAILED DESCRIPTION

Figure 1:
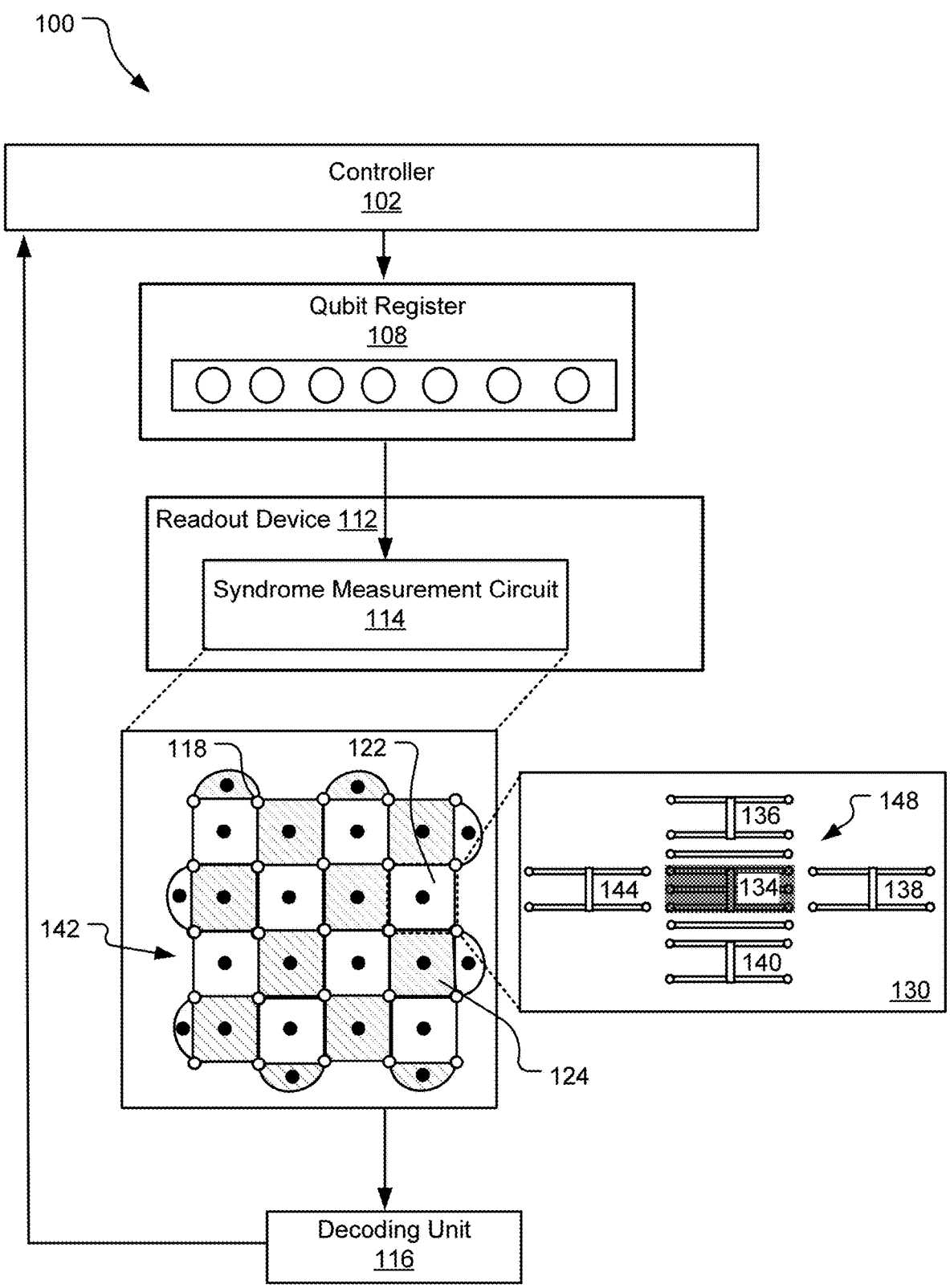
FIG. 1 illustrates example quantum computing system that performs error correction via a quantum measurement circuit that implements surface code using a measurement-only Majorana-based architecture.

Quantum computers may perform error correction using Quantum Error Correction Codes (QECCs). A QECC encodes a logical qubit into a collection of physical qubits such that the error rate of the logical qubit is lower than the physical error rate. In recent years, several error correction protocols have been proposed. QECCs enable fault tolerant quantum computations as long as the physical error rate is below an acceptable threshold at the expense of an increased number of physical qubits.

During quantum processing, entropy from the data qubits that encode protected data is transferred to the ancillary qubits that can be discarded. The ancillary qubits are positioned to interact with data qubits such that it is possible to detect errors by measuring the ancillary qubits and to correct such errors using a decoding unit.

An important class of error correcting codes are stabilizer codes. In the case of stabilizer codes, the logical qubit is defined as the simultaneous+1 eigenspace of some number of commuting multi-qubit Pauli operators, referred to as the stabilizers. By repeatedly measuring a quantum system using a complete set of commuting stabilizers, data bits associated with each ancilla qubit are forced into a simultaneous and unique eigenstate of all of the stabilizers allowing one to measure the stabilizers without perturbing the system. When the measurement outcomes change, this corresponds to one or more qubit errors and the quantum state is projected by the measurements onto a different stabilizer eigenstate. Errors are detected by repeatedly measuring the stabilizers; deviations from the expected outcome of +1 indicate errors.

Within the class of stabilizer codes, the surface code is considered the most promising QECCs for fault tolerant quantum computing. The simplest realization is defined on a rectangular lattice of qubits, whose plaquettes are divided into two sublattices in a checkerboard pattern. There is one stabilizer for each plaquette: for one sublattice, it is given by the product of the four Pauli X operators of the data qubits around a plaquette; for the other sublattice, it is given by the corresponding product of four Pauli Z operators.

In most practical proposals for implementing the surface code, the stabilizer measurement (e.g., the product of four Pauli operators acting on the data qubits around a plaquette) is achieved by adding an additional ancillary qubit to each plaquette, entangling it in a particular way with its adjacent data qubits, and finally performing a single-qubit measurement on the ancillary qubit.

Since the measurement of Pauli operators translates into topologically protected parity measurements in MZM-based architecture, Pauli stabilizer codes map ideally onto such architectures. According to one implementation of the disclosed technology, a surface code is implemented in a quantum device via a measurement circuit formed of mesoscopic superconducting islands, which are more specifically referred to herein as Majorana hexons (or simply "hexons") and *Majorana tetrons* (or simply "tetrons"). In implementing surface code to correct measurement errors, an optimized stabilizer measurement is effected by measuring sequences of topologically-protected Majorana-based qubits arranged on nearest-neighbor mesoscopic superconducting islands. According to the proposed approach, this stabilizer measurement can be performed using only measurements that involve two or four MZMs at once (e.g., 2-MZM or 4-MZM measurements) and where each such measurement involves the MZMs on either a single island or on two nearest-neighbor islands. Due to the reduced number of measurements and proximity of MZMs involved in the measurements, this stabilizer measurement can be implemented with significantly fewer processing resources than previous measurement-only approaches.

Below, FIG. 1 and the associated description provides an overview of a quantum computing system and type of measurement circuit that may be implemented using the proposed measurement-only Majorana-based surface code architecture. FIG. 2 and the association description discusses individual building blocks of this architecture while the discussion with respect to FIG. 3-4 introduces details of the proposed surface code architecture and of an exemplary optimized use of such architecture.

FIG. 1 illustrates example quantum computing system 100 that performs error correction via a syndrome measurement circuit 114 that implements surface code using a measurement-only Majorana-based architecture.

The quantum computing system 100 includes a controller 102 that performs calculations by manipulating qubits within a quantum register 108. To enable fault tolerant quantum computation in the quantum computing system 100, a readout device 112 includes a syndrome measurement circuit 114 that applies a surface code to the qubits in the qubit register 108. The syndrome measurement circuit 114 uses additional qubits—known as "ancillary qubits"—to perform computations involving the data qubits in the quantum register 108. The syndrome measurement circuit 114 performs measurements of the ancillary qubits in the quantum computer to extract syndromes providing information measured with respect to errors (faults). In order to avoid accumulation of errors during the quantum computation, the syndrome data is constantly measured, producing r syndrome bits for each syndrome measurement round. In one implementation, the syndrome data is measured with a frequency of every 1 μs.

The syndrome data output by the syndrome measurement circuit 114 is sent to the decoding unit 116, which implements one or more QECCs to analyze the syndrome data and to detect the location of each error and to correct each error within the syndrome measurement circuit 114. The decoding unit 116 returns information for correcting each detected error to the controller 102.

View 142 illustrates by example and without limitation a portion of a surface code architecture used to form the syndrome measurement circuit 114. The surface code architecture encodes a combination of data qubits, represented by hollow circles (e.g., a data qubit 118), and ancillary qubits, represented by solid circles (e.g., an ancillary qubit 120), arranged in a lattice-type structure defined by a number of plaquettes (e.g., plaquettes 122, 124) that each include a central ancillary qubit and four data qubits arranged at its corners.

During quantum processing, entropy from the data qubits that encode the protected data is transferred to the ancillary qubits (e.g., from the corners of the plaquette to the center ancillary qubit) that can be discarded after measurement. This transfer of data between the data qubits on the corners of each plaquette and the central ancillary qubit (e.g., ancillary qubit 120) is achieved via a process that includes entangling the four corner data qubits and the center ancillary qubit and then performing a projective measurement on the center ancillary qubit. This process, referred to herein as a "stabilizer measurement," yields an individual syndrome bit that is then sent to the decoding unit 116.

The surface code implements two types of stabilizer measurements—X-type stabilizer measurements and Z-type stabilizer measurements. Each plaquette in the syndrome measurement circuit 114 is used to perform either a X-type stabilizer measurement or Z-type stabilizer measurement. For example, the plaquettes with shaded faces (e.g., plaquette 124) may be used for the Z-stabilizer measurements and the unshaded plaquettes may be used for the X-stabilizer measurements. Under this architecture, the ancillary qubit at the center of each shaded plaquette is referred to as "measure-Z" qubit while the ancillary qubit at the center of each unshaded plaquette is referred to as a "measure-X" qubit. Each measure-X and measure-Z qubit is coupled to four data qubits (e.g., the four nearest hollow circles), and each data qubit is individually coupled to two measure-Z qubits and two measure-X qubits (e.g., the four nearest solid filled circles).

The stabilizer measurement for an individual plaquette 122 of the surface code entails a sequence of measurements that entails at least (1) performing a first measurement to initialize the central ancillary qubit in its computational state 10); (2) four CNOT operations to entangle all five qubits on the plaquette 122; and (3) a projective measurement of the central ancillary qubit.

On plaquettes used to perform the Z-type stabilizer measurement, the 4-CNOT measurements (step (2) above), target the measure qubit with the four nearest-neighbor data qubits as the controls, with the projective measurement yielding an eigenstate of $\hat{Z}_a\hat{Z}_b\hat{Z}_c\hat{Z}_d$. For plaquettes used to perform the X-type stabilizer measurement, the four CNOTs target the nearest-neighbor data qubits using the measure qubit as the control, and the sequence also includes a Hadamard applied to the measure qubit before and after the CNOTs. As alternative to applying Hadamard gates in this way, one may initialize the measure-X qubit using a measurement of the $\hat{X}$ operator and perform the final syndrome readout (after the sequence of CNOTs) by a measurement of the g operator on the measure-X qubit. The projective measurement yields an eigenstate of $\hat{X}_a\hat{X}_b\hat{X}_c\hat{X}_d$. In one implementation where the lattice structure shown represents a single logical qubit, the projective measurements of all of the measure qubits in the logical qubit causes the state $|\psi\rangle$ of all of the data qubits in the logical qubit to simultaneously satisfy $\hat{Z}_a\hat{Z}_b\hat{Z}_c\hat{Z}_d|\psi\rangle = \hat{Z}_{abcd}|\psi\rangle$, with eigenvalues $\hat{Z}_{abcd} = \pm 1$, and $\hat{X}_a\hat{X}_b\hat{X}_c\hat{X}_d|\psi\rangle$, with eigenvalues $\hat{X}_{abcd} = \pm 1$. Following measurement, the cycle is repeated. The stabilizer measurement of all ancillary qubits is performed so that every step in either the X-type syndrome measurement circuit or the Z-type syndrome measurement circuit is completed on each plaquette in the lattice (the logical qubit) before the next step begins.

In different quantum platforms, four CNOT operations of the surface code stabilizer measurement may be implemented in a variety of ways. In the architecture proposed herein, MZMs are used to implement the surface code. The ancillary qubit at the center of each plaquette (e.g., plaquette 122) is implemented by an MZM structure known as a *Majorana hexon*, referred to herein as a "hexon," that includes six MZMs. The data qubits at the corners of each plaquette are implemented by structures known as *Majorana tetrons*, referred to herein as "tetrons," which each include four MZMs. For example, view 130 of FIG. 1 illustrates a Majorana island group 148 including a central hexon 134 surrounded by four tetrons 136, 138, 140, and 144. Together, the hexon 134 and the tetrons 136, 138, 140, and 144 form the five data bits on the plaquette 122. The stabilizer measurement of the surface code can be implemented by performing sequences of joint fermionic parity measurements involving a small number of MZMs in the Majorana island group 148. For example, the four CNOT operations of the stabilizer measurement can be performed using a sequence of 2-MZM and 4-MZM parity measurements. This measurement-only approach using hexons and tetrons allows for more efficient computation that previous approaches.

Figure 2A:
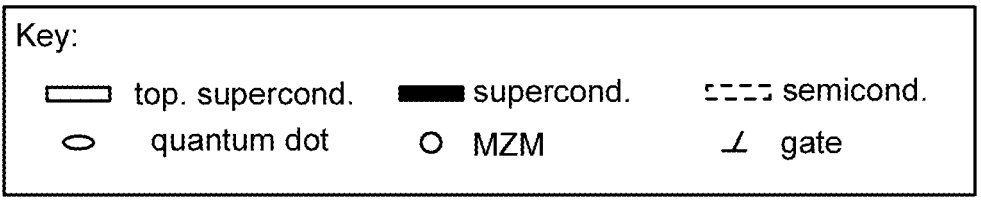
FIG. 2A illustrates an example two-sided *Majorana hexon* architecture useable to implement an efficient surface code syndrome measurement.
Figure 2A:
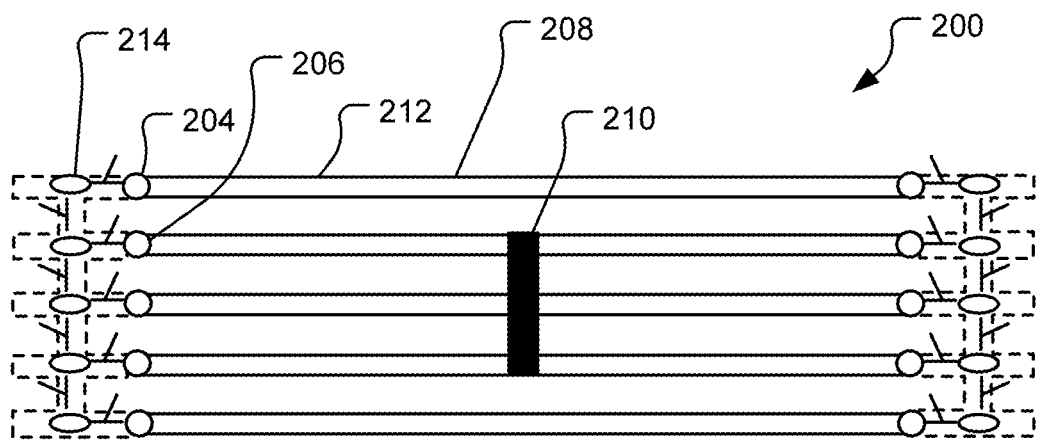
Figure 2B:
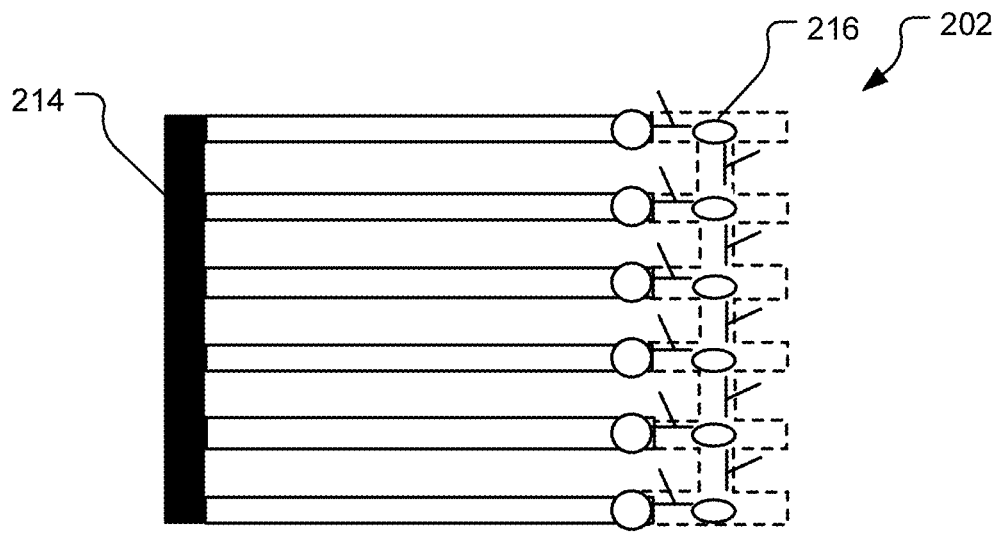
FIG. 2B illustrates an example one-sided *Majorana hexon* architecture useable to implement an efficient surface code syndrome measurement.

FIGS. 2A and 2B illustrates example MZM hexon architectures 200, 202 useable to implement an efficient surface code syndrome measurement. An MZM hexon (referred to herein as simply a "hexon") is a superconducting island that contains six MZMs (e.g., an MZM 204), where some of these MZMs are used to encode the qubit state and some serve as ancillary degrees of freedom that facilitate measurement-based operations. The MZM hexon architecture 200 in FIG. 2A is a two-sided hexon while the MZM hexon architecture 202 of FIG. 2B is single-sided hexon.

While a qubit can also be formed from four MZMs (referred to as a tetron when on an isolated superconducting island), due to the absence of ancillary MZMs, such a qubit by itself does not permit any topologically-protected unitary gate operations. A hexon, on the other hand, allows for the full set of single-qubit Clifford gates to be implemented with topological protection.

According to one implementation, MZMs (e.g., MZMs 204, 206) included in each hexon are coupled by a topological superconductor wire (e.g., topological superconductor 208) and a spine made from trivial (s-wave) superconductor (e.g., superconductors 210, 214).

In the two-sided architecture of FIG. 2A, three superconductor wires are joined by a spine in the middle and MZMs are present at both ends of each superconductor 208. In the one-sided architecture of FIG. 2B, six nanowires are joined by the spine 210 at one of their ends and, thus, MZMs are present only at the other end. An important benefit of these architectures is that a single qubit island is galvanically isolated (except for weak coupling to dots, see below), and thus Coulomb interactions give rise to a finite charging energy $E_C$ for the island. This helps to prevent (extrinsic) quasiparticle poisoning, as the probability for an electron to tunnel onto or off of the island from outside is exponentially suppressed in the ratio of the charging energy $E_C$ to temperature, $\exp(-E_C/k_BT)$. Decoherence of topologically protected states due to thermally excited quasiparticles on the island is suppressed by $\exp(-\Delta/k_BT)$, where $\Delta$ is the topological gap. Degeneracy splitting due to virtual tunneling of fermions between MZMs is suppressed by $\exp(-L/\xi)$, where L is the separation of MZMs and $\xi$ the superconducting coherence length.

According to on implementation, projective measurements of the joint fermionic parity of any two MZMs (2-MZM measurements) can be carried out by enabling weak coherent single-electron tunneling between the MZMs and adjacent quantum dots (e.g., quantum dots 214, 216), forming an interference loop. Projective measurements of the collective fermionic parity of 2N-MZMs may be performed similarly, though care must be taken to ensure that the interference loop involves all 2N MZMs, e.g. fermions cannot pass directly between the various quantum dots involved. These couplings gives rise to shifts in the energy spectrum and charge occupation of the dot that depend on the fermionic parity of the MZMs. These shifts can, in turn, be measured using established techniques developed for charge and spin qubits, such as charge sensing or quantum capacitance measurements. Importantly, the measurement is topologically protected in the sense that the operator that is being measured is known up to corrections that are exponentially small in the distance separating the MZMs through the superconducting region (nanowire and spine).

Figure 3:
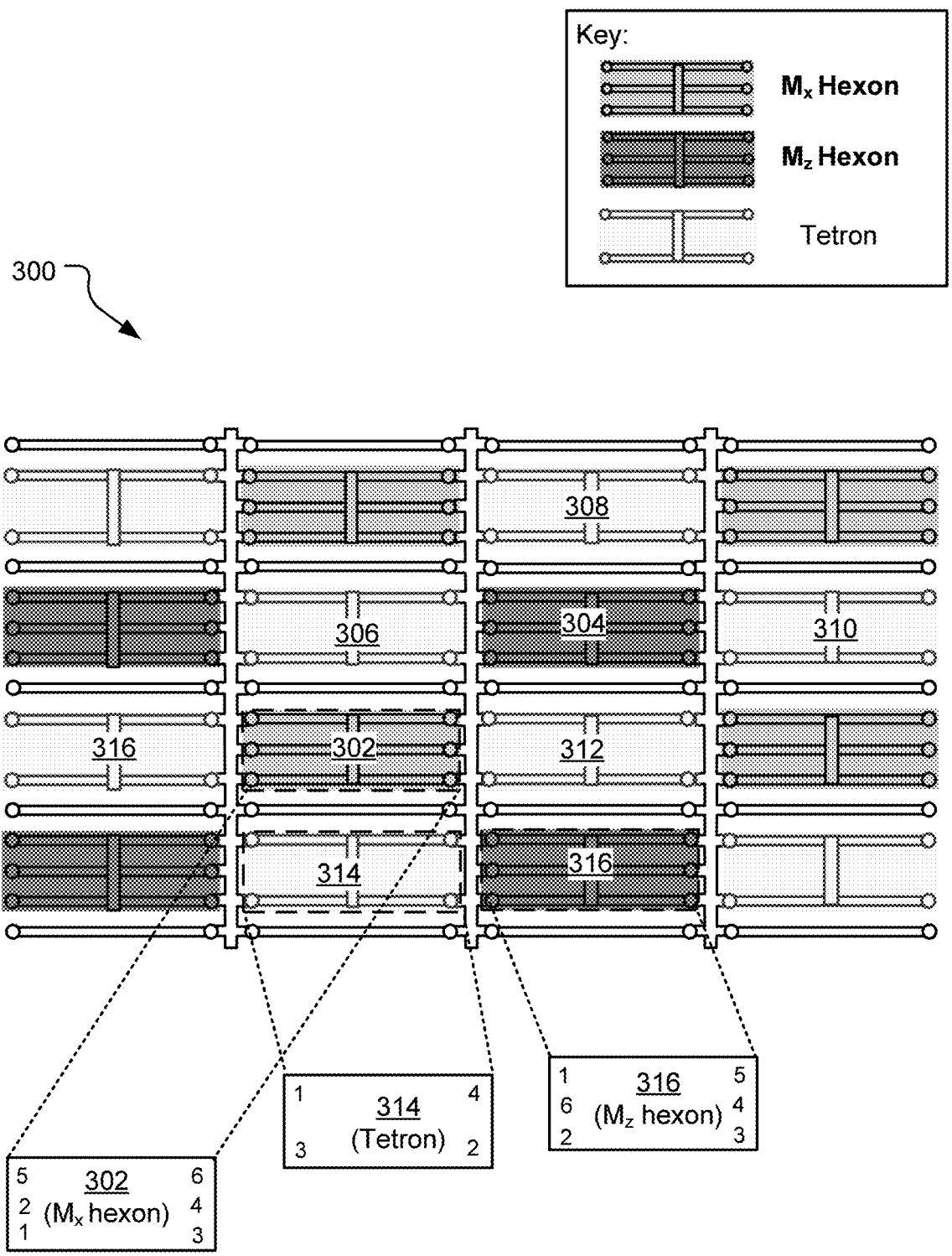
FIG. 3 illustrates an example surface code architecture formed by mesoscopic superconducting islands including Majorana hexons and *Majorana tetrons*.

Multiple hexons can be arranged into an array, and multi-qubit operations (e.g., CNOT operations used in the surface code stabilizer measurements) may be performed by weakly coupling MZMs from different islands (e.g., different hexons or tetrons) to common quantum dots. Since the coupling between MZMs and quantum dots is weak, the charging energy protection against quasi-particle poisoning remains effective during such operations. This restricts the operators that can be measured to ones that commute with the charging energy (or total parity) on each island, which are precisely the measurements involving an even number of Majorana operators on each island FIG. 3 illustrates an example surface code architecture 300 formed by mesoscopic superconducting islands of two different forms—tetrons and hexons—all arranged in a rectangular array. While the hexons (e.g., hexons 302, 304) may have individual structures the same or similar to those discussed above with respect to FIGS. 2A and 2B above, the tetrons (e.g., tetrons 306, 308, 310, 312, 314, and 316) may be understood as a structure including four MZMs each positioned at the end of a topological superconductor and attached to a same superconductor.

Majorana hexons each host six Majorana zero modes, which is the smallest number of MZMs that encodes the combination of two qubits. Using one of the qubits as a data qubit and the other as an ancillary qubit facilitates arbitrary single-qubit Clifford operations on the data qubit in a measurement-only topologically protected manner.

*Majorana tetrons*, in contrast, each host four Majorana zero modes, represented by circles in the corners, that may be used to collectively encode a single computational qubit in the nonlocal (topological) state space of the MZMs—the joint fermionic parity of pairs of the MZMs. In isolation, a single *Majorana tetron* may be used to perform Pauli operator measurements of the qubit but not to enact a Clifford gate. However, it has been shown that all n-qubit Clifford operations with topological protection can be performed using joint parity measurements of 4 MZMs, two from one *Majorana tetrons* and two from another.

In the surface code architecture 300, tetrons play the role of data qubits while the hexons are used as ancillary qubits that facilitate unitary operations and the implementation of the X and Z stabilizer measurements. In order to avoid confusion between the term "ancillary qubit" used in reference to the second qubit encoded within a hexon and in reference to the qubits used to facilitate stabilizer measurements in the surface code, ancillary qubits of the surface code are referred to in the following description as "ancillary hexons."

In FIG. 3, ancillary hexons represented on light grey shaded plaquettes correspond to the ancillary qubits in the surface code that facilitate the measurements of the X stabilizer. These hexons may also be referred to herein as "$M_X$-hexons." Likewise, the ancillary hexons represented on dark grey shaded plaquettes correspond to the ancillary qubits in the surface code that facilitate measurements of the Z-stabilizer. These hexons are referred to herein as "$M_Z$-hexons."

As discussed with respect to FIG. 1, each X-stabilizer and Z-stabilizer is achieved via a syndrome measurement circuit that entails an initialization of the central ancillary qubit in its computational state $|0\rangle$ followed by four CNOT operations and a projective measurement.

Due to the aforementioned properties of Majorana hexons and *Majorana tetrons*, implementation of each of the CNOT operations can be performed using either three *Majorana tetrons*, two Majorana hexons, or—in the proposed approach—one *Majorana hexon* and one *Majorana tetron*. This mixed approach is advantageous because it provides an optimized tradeoff between efficiency and qubit quality. This is due, in part, to the fact that *Majorana tetrons* exhibit longer lifetimes (better quality) but more *Majorana tetrons* are needed to perform the same quantum operations that can be performed by a single *Majorana hexon*. The proposed mix of hexon/tetron architectures reduces the total number of measurement operations needed to implement the surface code syndrome measurement as compared to existing approaches but also provides for higher overall qubit quality.

According to one implementation, the surface code syndrome measurement circuit is performed on each ancillary hexon performing a sequence of joint fermionic parity measurements on nearest-neighbor Majorana qubit islands, where each individual measurement in the sequence involves no more than two of the nearest neighbor islands.

Before introducing specific exemplary measurement sequences that optimize the efficiency of the surface code syndrome measurement circuit, a discussion of hexon space state, operators, and notation first introduced below.

Single-Hexon State Space and Operators

The MZMs in each hexon may be numerically referred to as 1, 2, 3, 4, 5, and 6. Likewise, the MZMs in each tetron may be numerically referred to as 1, 2, 3, 4. In the notation used in the following discussion, each of these MZMs is represented by a Majorana fermionic operator $\gamma_j$ to the MZM at the jth position. These operators obey the usual fermionic anti-commutation relations $\{\gamma_j, \gamma_k\} = 2\delta_{jk}$. For any ordered pair of MZMs j and k, their joint fermionic parity operator is given by $i\gamma_j\gamma_k = -i\gamma_k\gamma_j$, which has eigenvalues $p_{jk} = \pm 1$ for even and odd parity, respectively. (The conventions in this paper will differ slightly from those of Ref. [15].) The corresponding projection operator onto the subspace with parity $s = p_{jk} = \pm 1$ is given by $$\Pi_s^{(jk)} = \Pi_{-s}^{(kj)} = \tfrac{1}{2}(1 + si\gamma_j\gamma_k). \tag{1}$$

The operator $i\gamma_j\gamma_k$ can then be expressed as $$i\gamma_j\gamma_k = \Pi_+^{(jk)} - \Pi_-^{(jk)} \tag{2}$$

where the shorthand $\pm$ for $\pm 1$ is used for the even-parity (vacuum) and odd-parity (fermion) channels, respectively.

In this way, the basis states $p_{12}$, $p_{34}$, $p_{56}$ may be used to represent a system of six MZMs in terms of the fermionic parities for some choice of how to pair them together. Due to the finite charging energy of the island, the system generically has ground states only in either the even or the odd collective fermion parity sector, which can be tuned using the gate voltage; without loss of generality, it can be assumed that the system is tuned to have ground states with even collective fermionic parity, i.e. $p_{12}p_{34}p_{56} = +1$, while states with odd collective parity are excited states associated with quasiparticle poisoning. In this way, the low-energy state space of the hexon is 4-dimensional, with basis states:

$$|+,+,+\rangle \tag{3}$$

$$|-,+,-\rangle = i\gamma_2\gamma_5|+,+,+\rangle, \tag{4}$$

$$|+,-,-\rangle = i\gamma_4\gamma_5|+,+,+\rangle. \tag{5}$$

$$|-,-,+\rangle = i\gamma_2\gamma_3|+,+,+\rangle. \tag{6}$$

Viewing this as a two-qubit system with the first qubit encoded in $p_{34}$ and the second qubit encoded in $p_{12}$, the above basis states are 0,0,0,1,1,0,1,1, in order. We can then express the MZM parity operators in terms of Pauli operators on these two qubits $$\begin{aligned}
i\gamma_1\gamma_2 &= 1 \otimes Z, & i\gamma_1\gamma_3 &= X \otimes Y, & i\gamma_1\gamma_4 &= -Y \otimes Y, & i\gamma_1\gamma_5 &= Z \otimes Y, \\
i\gamma_1\gamma_6 &= 1 \otimes X, & i\gamma_2\gamma_3 &= X \otimes X, & i\gamma_2\gamma_4 &= -Y \otimes X, & i\gamma_2\gamma_5 &= Z \otimes X, \\
i\gamma_1\gamma_6 &= -1 \otimes Y, & i\gamma_3\gamma_4 &= Z \otimes 1, & i\gamma_3\gamma_5 &= Y \otimes 1, & i\gamma_3\gamma_6 &= X \otimes Z \\
i\gamma_4\gamma_5 &= X \otimes 1, & i\gamma_4\gamma_6 &= -Y \otimes Z, & i\gamma_5\gamma_6 &= Z \otimes Z,
\end{aligned} \tag{7}$$

where the Pauli matrices are:

$$X = \begin{bmatrix} 0 & 1 \\ 1 & 0 \end{bmatrix}, Y = \begin{bmatrix} 0 & -i \\ i & 0 \end{bmatrix}, Z = \begin{bmatrix} 1 & 0 \\ 0 & -1 \end{bmatrix}. \tag{8}$$

FIG. 3 introduces a numbering convention with respect to hexon 316 in which the MZMs 3 and 4 serve as the ancillary MZMs with definite joint parity, e.g. $p_{34} = +1$, and the computational qubit is encoded in $p_{12}$. The remaining parity is correlated with the other two as $p_{56} = p_{12}p_{34}$, so when the ancillary pair has $p_{34} = +1$, the computational basis states are $$|0\rangle = |p_{12} = p_{56} = +\rangle, |1\rangle = |p_{12} = p_{56} = -\rangle \tag{9}$$

and when $p_{34} = -1$, the computational basis states are $$|0\rangle = |p_{12} = -p_{56} = +\rangle, |1\rangle = |p_{12} = -p_{56} = -\rangle. \tag{10}$$

Another way to view this is that a hexon is a Majorana stabilizer code which encodes a single logical qubit in six MZMs. In this language, logical qubits are defined to be in the simultaneous+1 eigenspace of a group of operators, called the stabilizer group. The logical gates which act on this space are operators which commute with the stabilizer group but are not themselves stabilizers. For the case of a hexon, the stabilizer group is generated by the total parity of the island $i^3\gamma_1\gamma_2\gamma_3\gamma_4\gamma_5\gamma_6$ and the parity of the ancillary pair $i\gamma_3\gamma_4$. The logical Pauli operators are taken to be $\overline{Z}=i\gamma_1\gamma_2$ and $\overline{X}=i\gamma_1\gamma_6$.

The Syndrome Measurement Circuit for an Ancillary Hexon

According to one implementation, the syndrome measurement circuit for a single $M_X$-hexon 302 (e.g., to measure its logical qubit) entails the following sequence of operations:
1. initialize the $M_X$-hexon 302 into the X=+1 state, with the hexon's ancillary qubit in an arbitrary, but definite state (e.g., into a $i\gamma_1\gamma_6$=+, $i\gamma_3\gamma_4$=$p_{34}$ state);
2. apply a sequence of CNOT operations: $C(X)_{(h_x,t_4)}$ $C(X)_{(h_x,t_3)}C(X)_{(h_x,t_2)}C(X)_{(h_x,t_1)}$, controlled on the $M_X$-hexon (labeled $h_x$) and targeting the four nearest-neighboring tetrons (labeled $t_j$); and
3. measure the $M_X$-hexon 302 in the X-basis. (e.g., measure $i\gamma_1\gamma_6$).

The effect of this sequence of steps is a measurement of $X^{\otimes 4}$ of the four data tetrons 306, 312, 314, and 316. The outcome of the final measurement (in step 3), is the outcome of this stabilizer measurement.

According to one implementation, the syndrome measurement circuit for a single $M_z$-hexon 304 entails the following sequence of operations:
1. Initialize a $M_x$-hexon qubit into the 0 (Z=+1) state, with the hexon's ancillary qubit in an arbitrary, but definite state (i.e. into a $i\gamma_1\gamma_2$=+, $i\gamma_3\gamma_4$=$p_{34}$ state);
2. Apply the sequence of CNOTs: $C(X)_{(t_4,h_z)}C(X)_{(t_3,h_z)}C(X)_{(t_2,h_z)}C(X)_{(t_1,h_z)}$, controlled on the four nearest-neighboring tetrons (labeled $t_j$) and targeting the $M_Z$-hexon (labeled $h_z$); and
3. Measure the $M_Z$-hexon in the Z-basis (i.e. measure $i\gamma_1\gamma_2$).

The effect of this sequence of steps is a measurement of $Z^{\otimes 4}$ of the four data tetrons. The outcome of the final measurement (in step 3), is the outcome of this stabilizer measurement.

A most efficient computation of the foregoing depends upon optimized compilations of these circuits (e.g., steps 1-3 in each of the above scenarios). Since steps 1 and 3 above are simply measurements (two needed for step 1 and one for step 3), they leave no room for optimizing. Thus, step 2 can be focused instead, and search for optimal measurement sequences realizing the two sequences of CNOT gates, which may be denoted as $$L_X = C(X)_{(h_x,t_4)}C(X)_{(h_x,t_3)}C(X)_{(h_x,t_2)}C(X)_{(h_x,t_1)} \quad (11)$$

$$L_Z = C(X)_{(t_4,h_z)}C(X)_{(t_3,h_z)}C(X)_{(t_2,h_z)}C(X)_{(t_1,h_z)}. \quad (12)$$

Figure 4:
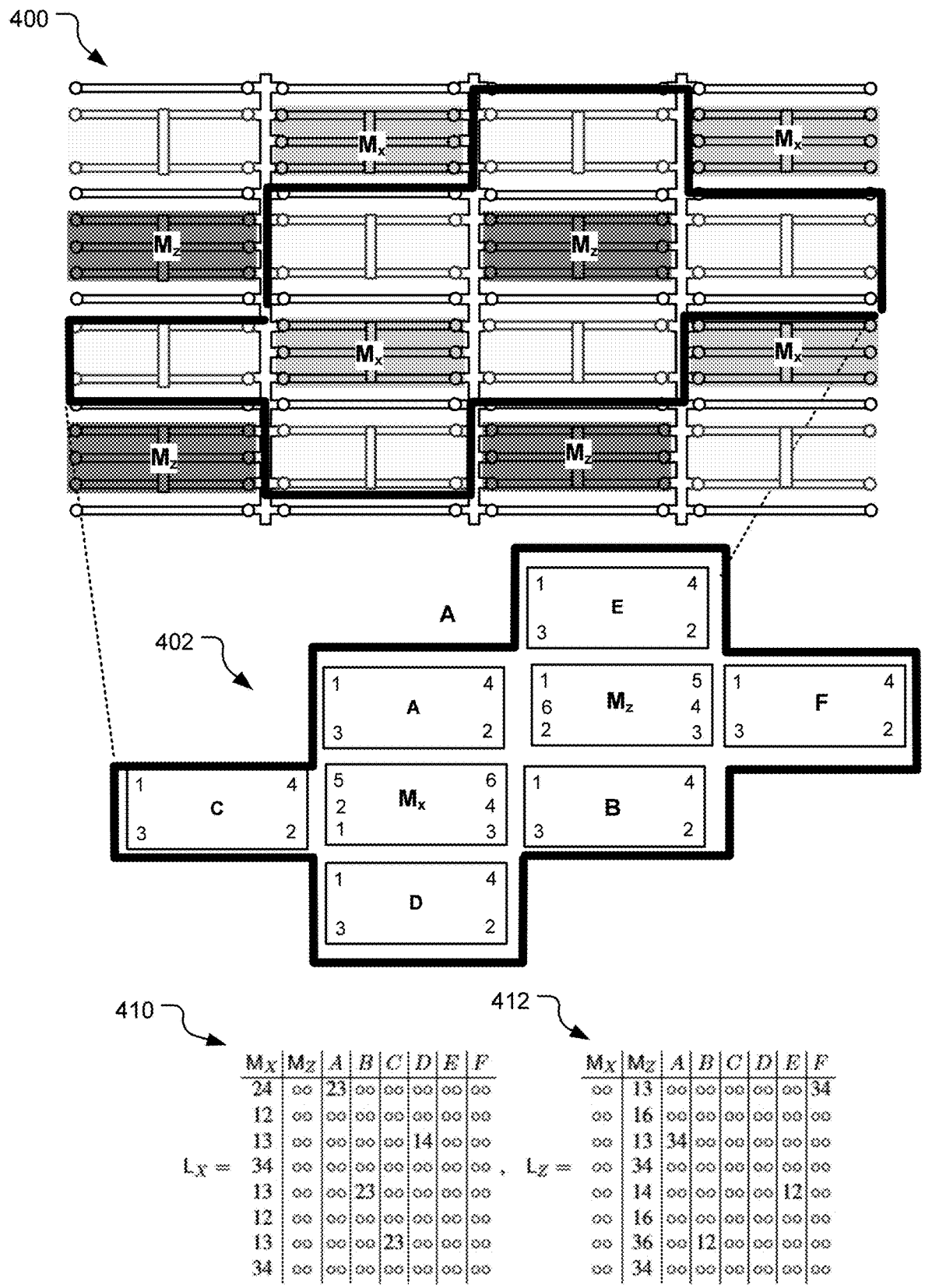
FIG. 4 illustrates further aspects of an example surface code architecture comprising *Majorana hexon* and *Majorana tetron* islands.

FIG. 4 illustrates further details of an exemplary surface code architecture 400 with respect to exemplary representations of $L_X$ and $L_Z$ measurement circuits 410 and 412 (see eq. 11 and 12 above) that may be used to implement the four CNOTs in each of the X-type and Z-type stabilizer measurement circuits. Notation needed to interpret the $L_x$ and $L_z$ circuits of FIG. 4 is discussed in detail below with respect to an exploded view 402 of the surface code architecture 400 and an exemplary MZM numbering scheme.

The exploded view 402 illustrates a portion of the surface code including six tetrons (labeled with letters A, B, C, D, E, F, G) and two hexons ($M_Z$ and ($M_z$). In this structure, the $M_x$ hexon is surrounded by tetrons A, B, C, and D, which each serve the role of an individual data qubit. The $M_e$ hexon is similarly surrounded by four tetrons E, F, A, and B. acting as the data qubits. Within each hexon and tetron, the MZMs are labeled by number according to an exemplary numbing scheme. The *Majorana tetrons* each support modes 1, 2, 3, and 4 while the *Majorana hexon* supports modes 1, 2, 3, 4, 5, 6.

The measurement circuits 410 and 412 in FIG. 4 each provide an sequence of projective measurements of 2-MZM and 4-MZM joint fermionic parity that may, according to one optimized approach, be performed to implement $L_X$ and $L_z$ as set forth in equations 11 and 12 above (e.g., to measure the sequence of four CNOTs in the X and Z-type syndrome measurement circuits). Specifically, the measurement circuit 410 illustrates a sequence of projective measurements for measuring the ancillary qubit encoded by *Majorana tetron* A (an $M_x$-hexon) while the measurement circuit 412 illustrates a sequence of projective measurements for measuring the ancillary qubit encoded by *Majorana tetron* F (a $M_z$-hexon).

The specific fermionic parity measurements and ordering of measurements shown by the measurement circuits 410 and 412 is intended to be exemplary but non-exclusive. Notably, there exist countless solutions for implementing $L_X$ and $L_z$ with variable sequence lengths (number of measurements) and variable difficulty costs (discussed below) for individual measurements. The measurement circuits 410 and 412, also shown in Table 1.0 below, represent one optimized approach derived in accord with the following discussion.

TABLE 1.0

| $M_X$ | $M_Z$ | A | B | C | D | E | F | |
|---|---|---|---|---|---|---|---|---|
| 24 | oo | 23 | oo | oo | oo | oo | oo | (13) |
| 12 | oo | oo | oo | oo | oo | oo | oo | |
| 13 | oo | oo | oo | oo | 14 | oo | oo | |
| $L_X =$ 34 | oo | oo | oo | oo | oo | oo | oo | |
| 13 | oo | oo | 23 | oo | oo | oo | oo | |
| 12 | oo | oo | oo | oo | oo | oo | oo | |
| 13 | oo | oo | oo | 23 | oo | oo | oo | |
| 34 | oo | oo | oo | oo | oo | oo | oo | |

| $M_X$ | $M_Z$ | A | B | C | D | E | F | |
|---|---|---|---|---|---|---|---|---|
| oo | 13 | oo | oo | oo | oo | oo | 34 | (14) |
| oo | 16 | oo | oo | oo | oo | oo | oo | |
| oo | 13 | 34 | oo | oo | oo | oo | oo | |
| $L_Z =$ oo | 34 | oo | oo | oo | oo | oo | oo | |
| oo | 14 | oo | oo | oo | oo | 12 | oo | |
| oo | 16 | oo | oo | oo | oo | oo | oo | |
| oo | 36 | oo | 12 | oo | oo | oo | oo | |
| oo | 34 | oo | oo | oo | oo | oo | oo | |

$L_X$ and $L_Z$ Measurement Circuit Notation

With reference to the measurement circuit 410 ($L_X$) (also shown in Table 1.0 above) the first column corresponds to the $M_X$ hexon, the second column corresponds to the $M_z$ hexon and the four following columns correspond, from left to right, to the tetrons (A, B, C, D, E, and F) positioned as shown in exploded view 402. From top to bottom, 8 measurement steps are shown in different rows. These steps are used to implement $L_x$ and therefore the ancillary hexon (A) (representing the ancillary qubit in an individual surface code plaquette) with its four adjacent (B, C, D and E) (representing the data qubits in an individual surface code plaquette).

By example and without limitation, a first measurement step in $L_X$ (top row of the measurement circuit 410) is a 4-MZM measurement of the joint fermionic parity of MZMs 2 and 4 of the $M_X$ hexon with MZMs 2 and 3 of the top tetron (A). A second measurement step (second row), entails a 2-MZM measurement of the joint fermionic parity of MZMs 1 and 2 of $M_X$ hexon. A third measurement step (third row) entails a 4-MZM measurement of the joint fermionic parity of MZMs 1 and 3 of the $M_X$ hexon and MZMs 1 and 4 of the bottom tetron (D). The fourth, fifth, sixth, seventh, and eighth measurement steps are further provided by the measurement circuit 410 consistent with the above-described notation.

In the measurement circuit 412 ($L_z$), the notation is identical to that described above with respect to the measurement circuit 410 ($L_x$). Each of the $L_x$ and $L_z$ measurement circuits (e.g., the four CNOT operations of the stabilizer) is implemented via a sequence of eight measurement steps. Of these eight measurement steps, four include measurements of fermionic pairs on two different Majorana islands—the hexon and a single tetron, while the other four of these measurement steps are measurements of fermionic pairs on a single Majorana island—the hexon.

To measure the stabilizer in the associated surface code plaquette, these 8 steps in each circuit are preceded by two 2-MZM measurements on the hexon to prepare it in the appropriate initial state. The 8 steps are followed by a final measurement of hexon to determine the value of the syndrome. Thus, the total number of measurements to perform a stabilizer measurement utilizing either of the exemplary measurement circuits 410 and 412 is 11, which is believed to be the minimal number of measurements by which the surface code stabilizer measurement can be implemented in a measurement-only qubit framework.

As discussed above, the maximum number of Majorana islands involved in any measurement $L_x$ or $L_z$ is two and the majority of the measurements involve only a single island. This is advantageous because a greater number of islands involved in a measurement will lead to greater difficulty, poorer quality, and higher error probability of the corresponding measurement.

Efficient Computation of the $L_x$ and $L_z$ Measurement Circuits

In order to derive optimized compilations of $L_X$ (eq. 11) and $L_z$ (eq. 12), such as those shown as measurement circuits 410 and 412 in FIG. 4, one may first find measurement sequences separately compiling the individual CNOT gates $C(X)_{(h,t)}$ and $C(X)_{(t,h)}$, plug these sequences in for $C(X)_{(h,t)}$ and $C(X)_{(t,h)}$ in eq. 11 and 12, respectively, and finally attempt to reduce the length of the sequence with known methods.

In this case, it is helpful to find measurement sequence compilations by identifying the stabilizers and logical operators in a system comprising a hexon and tetron, and updating them appropriately as a sequence of measurements is performed. If the set of stabilizers at the end of a sequence of measurements is the same as the initial set of stabilizers, the sequence will yield a logical gate that is determined by the transformation of the logical Pauli operators. A given measurement sequence will compile to the target gate $C(X)_{(a,b)}$ if the logical Pauli operators transform the same way as they do under conjugation by $C(X)_{(a,b)}$, that is $$\begin{array}{l} X_a I_b \\ Z_a I_b \\ I_a X_b \\ I_a Z_b \end{array} \xrightarrow{C(X)_{(a,\,b)}} \begin{array}{l} X_a X_b \\ Z_a I_b \\ I_a X_b \\ Z_a Z_b. \end{array} \tag{15}$$

As discussed above with the section "Single-Hexon State Space and Operators," a hexon encodes one logical qubit in six MZMs, is stabilized by the total parity of the island $i^3 \gamma_1 \gamma_2 \gamma_3 \gamma_4 \gamma_5 \gamma_6 = +1$, and is restricted to a further ancillary parity sector, which may, by example and without limitation, be initialized as $i\gamma_3\gamma_4 = p_{34} = \pm 1$. The set of generators for the initial hexon stabilizer group is therefore $S_{hex} = \langle i^3\gamma_1\gamma_2\gamma_3\gamma_4\gamma_5\gamma_6, i\gamma_3\gamma_4 \rangle$. The corresponding logical Pauli operators (acting on the logical qubit) for a hexon island are $\overline{X}_{hex} = [i\gamma_1\gamma_6]$, $\overline{Y}_{hex} = [-i\gamma_2\gamma_6]$, and $\overline{Z}_{hex} = [i\gamma_1\gamma_2]$, where the equivalence classes contain all parity operators related by multiplication by a stabilizer. The 2-MZM parity operators for hexons can be mapped back to Pauli operators via Eq. 7, above.

Similarly, a tetron encodes one logical qubit in four MZMs and is stabilized by the total parity of the island $i_2\gamma_1\gamma_2\gamma_3\gamma_4$. The stabilizer group is therefore $S_{tet} = \langle i^2\gamma_1\gamma_2\gamma_3\gamma_4 \rangle$. The corresponding logical Pauli operators are $\overline{X}_{tet} = [i\gamma_1\gamma_4]$, $\overline{Y}_{tet} = [-i\gamma_2\gamma_4]$, and $\overline{Z}_{tet} = [i\gamma_1\gamma_2]$. The 2-MZM parity operators for tetrons can be mapped back to Pauli operators via $$i\gamma_1\gamma_2 = Z, \quad i\gamma_1\gamma_3 = Y, \quad i\gamma_1\gamma_4 = X, \tag{16}$$
$$i\gamma_2\gamma_3 = X, \quad i\gamma_2\gamma_4 = -Y,$$
$$i\gamma_3\gamma_4 = Z.$$

When a measurement of the operator $\Gamma_M$ is performed, the stabilizers and logical operators are updated according to the rules set forth in Table 2.0 below.

TABLE 2.0

Rules for Updating Stabilizers and Logical Operators

Let S be the full stabilizer group and $\overline{P}$ be the equivalence class of a logical Pauli operator:
1. Write $S = S_c \cup S_A$, where $S_c$ is the subgroup of stabilizers that commute with $\Gamma_M$ and $S_A$ is the set of stabilizers that anticommute with $\Gamma_M$.
2. Update the stabilizer group to: $S' = S_c \times \langle \Gamma_M \rangle$.
3. Write each logical Pauli operator $\overline{P}$ as $\overline{P} = \overline{P}_c \cup \overline{P}_A$, where $\overline{P}_c$ is the subset of parity operators in the equivalence class that commute with $\Gamma_M$ and $\overline{P}_A$ is the subset of parity operators in the equivalence class that anticommute with $\Gamma_M$.

TABLE 2.0-continued

Rules for Updating Stabilizers and Logical Operators

4. Update each logical Pauli operator to: $\overline{P}' = \overline{P}_c \cup \overline{P}_c \Gamma_\mathcal{M} = [P_c]'$, for any $P_c \in \overline{P}c$,
where [•]' is the equivalence class under multiplication by the updated stabilizer S'.
For computational purposes, it is typically more convenient to work with a minimal
set of generators of the stabilizer group and a single representative of the logical
operators. Let J be a minimal set of generators of the stabilizer, i.e. ⟨J⟩ = S
and |J| = 2N. Let $P \in \overline{P}$ be a representative element of the logical Pauli operator.
These objects are updated after measuring $\Gamma_\mathcal{M}$ according to the following steps:
 1. Identify all elements $A_1, \ldots, A_n \in J$ that anticommute with $\Gamma_\mathcal{M}$.
 2. Update the generating set the stabilizer group to: $J' = J \cup \{\Gamma_\mathcal{M}, A_1 A_2, \ldots, A_1 A_n\} \setminus \{A_1, \ldots, A_n\}$.
 3. Update the representative element of each logical Pauli operator to: P' = P if P
    commutes with $\Gamma_\mathcal{M}$, or to P' = $A_1$P if P anticommutes with $\Gamma_\mathcal{M}$.
From this, it is clear that S' = ⟨J'⟩, |J'| = |J|, and $P' \in \overline{P}' = [P']'$.

In discussing stabilizers for the purposes of gate synthesis, it can be assumed the total parity of each island is always fixed (this is only violated by quasiparticle poisoning errors that flip the parity of an island, which may be neglected for the discussion herein, so the stabilizers corresponding to total island parity ($i^3\gamma_1\gamma_2\gamma_3\gamma_4\gamma_5\gamma_6$=+1 for hexons and $i^2\gamma_1\gamma_2\gamma_3\gamma_4$=+1 for tetrons) will be left implicit.

Example Compilation of a $C(X)_{(h,t)}$

An example of a measurement sequence realizing $C(X)_{(h,t)}$ (e.g., one of the four CNOT operations in the measurement circuit given by $L_X$ or $L_Z$ in equations 11 and 12 above) is shown in Table 3.0 below.

TABLE 3.0

| Step | Measurement of | Stabilizer | $\overline{X}_{hex}\overline{I}_{tet}$ | $\overline{Z}_{hex}\overline{I}_{tet}$ | $\overline{I}_{hex}\overline{X}_{tet}$ | $\overline{I}_{hex}\overline{Z}_{tet}$ |
|---|---|---|---|---|---|---|
| | — | 34\|oo | 16\|oo | 12\|oo | oo\|14 | oo\|12 |
| | 46\|14 | 46\|14 | 25\|oo | 12\|oo | oo\|14 | 34\|12 |
| | 56\|oo | 56\|oo | 13\|14 | 12\|oo | oo\|14 | 34\|12 |
| | 46\|oo | 46\|oo | 13\|14 | 12\|oo | oo\|14 | 12\|12 |
| | 34\|oo | 34\|oo | 25\|14 | 12\|oo | oo\|14 | 12\|12 |
| | | | $\overline{X}_{hex}\overline{X}_{tet}$ | $\overline{Z}_{hex}\overline{I}_{tet}$ | $\overline{I}_{hex}\overline{X}_{tet}$ | $\overline{Z}_{hex}\overline{Z}_{tet}$ |

In table 3.0, the shorthand abκd (also introduced above with respect to the measurement circuits in table 2.0) is used to mean $(i\gamma_a\gamma_b)_{hex}\otimes(i\gamma_c\gamma_d)_{tet}$ and oo to mean that the corresponding hexon or tetron is not involved. As mentioned, the overall island parity stabilizers are left implicit, since they are assumed to be fixed throughout the process. Furthermore, we do not explicitly account for signs in the stabilizers or logical operators. For example, $(i\gamma_1\gamma_2)(i\gamma_1\gamma_3) = -i\gamma_2\gamma_3$, but would be recorded as 23. The effect of these signs is to alter the compiled gate by an overall Pauli operator, which can be determined by Pauli tracking.

The effect of the above measurement sequence is to apply a $C(X)_{(h,t)}$ gate controlled on the hexon and targeting a tetron, up to a Pauli operator. The full $L_X$ circuit can be built by concatenating variations of this circuit for each of the four tetrons. Then we can improve the efficiency by using known sequence manipulation and reduction tools. The same can be done for $C(X)_{(t,h)}$ gates and $L_Z$ circuits.

From the rules in Table 2.0 above, it is known that reversing a measurement sequence yields the inverse of the compiled gate. Since $C(X)^\dagger = C(X)$, the corresponding measurement sequence can be freely reversed, as below:

$$\begin{array}{c} 46|14 \\ 56|oo \\ 46|oo \\ 34|oo \end{array} \xrightleftharpoons{\text{reverse}} \begin{array}{c} 46|oo \\ 56|oo \\ 46|14 \\ 34|oo \end{array}.$$

Notably, an initialization of $i\gamma_3\gamma_4$ is assumed herein such that all sequences implicitly start with a $i\gamma_3\gamma_4$ stabilizer. Immediate repetitions of the same measurement can be reduced, since $\Pi_r^{(M)}\Pi_s^{(M)} = \delta_{r,s}\Pi_s^{(M)}$. Furthermore, triplets of measurements of $M_1$, $M_2$, and then $M_1$, where $\{\Gamma_{M_1}, \gamma_{M_2}\} = 0$ can be reduced, since $\Pi_r^{(M_1)}\Pi_s^{(M_2)}\Pi_t^{(M_1)} \propto (\delta_{r,t} + s\Gamma_{M_2}\delta_{-r,t})\Pi_t^{(M_1)}$ for such measurements.

A full $L_X$ circuit can then be compiled and reduced in the following way:

[diagram of measurement sequence blocks with "reverse blocks 2,4" and "reduce" arrows]

Here, the first column corresponds to the ancillary hexon (e.g., hexon 302) and the next four columns correspond to each of the neighboring tetrons (e.g., 306, 312, 316, and 314). This reduces the naïve length 16 measurement sequence to a length 8 measurement sequence, where each tetron is involved in only a single 4-MZM measurement.

In a similar fashion, the $C(X)_{(t,h)}$ gates, which are used to construct the $L_Z$ circuit, can be compiled, combined, and then reduced:

$$
\begin{array}{|c|c|c|c|c|}
\hline
14 & 12 & 00 & 00 & 00 \\
\hline
16 & 00 & 00 & 00 & 00 \\
\hline
36 & 00 & 00 & 00 & 00 \\
\hline
34 & 00 & 00 & 00 & 00 \\
\hline
\end{array}
\rightarrow
\begin{array}{|c|c|c|c|c|}
\hline
14 & 12 & 00 & 00 & 00 \\
\hline
16 & 00 & 00 & 00 & 00 \\
\hline
14 & 00 & 12 & 00 & 00 \\
\hline
34 & 00 & 00 & 00 & 00 \\
\hline
14 & 00 & 00 & 12 & 00 \\
\hline
12 & 00 & 00 & 00 & 00 \\
\hline
14 & 00 & 00 & 00 & 12 \\
\hline
34 & 00 & 00 & 00 & 00 \\
\hline
\end{array}
$$

This also reduces the naïve length 16 measurement sequence to a length 8 sequence, where each tetron is involved in only one 4-MZM measurement. This represents but one of many different sequences usable to implement the $L_X$ and $L_z$ circuits. Notably, the above-derived solutions for $L_x$ and $L_z$ are realized via significantly fewer measurements than other existing measurement-only approaches.

It is to be understood that optimization of the $L_z$ and $L_z$ circuits entails more than minimizing the number of steps in the $L_X$ and $L_z$ circuits. Experimentally, certain measurements will be more difficult to perform than others and thus entail greater computation time. For example, measurements on MZMs nearer to each other can be expected to be less faulty and require fewer resources than measurements involving distant MZMs. According to one approach, available length-8 sequences are identified and the optimal circuits are selected using a cost function to account for the relative difficulties of the different measurements within each sequence.

One exemplary approach to such sequence optimization provides for first dividing the $L_X$ and $L_z$ circuits into two segments, each of which involves two applications of C(X) that can be manipulated as a pair and reduced. With this in mind, a search may then be conducted for all length -4 measurement sequences that alternate between 4-MZM measurements and 2-MZM measurements (each 4-MZM measurement is pairing the hexon with a tetron in a different direction on the lattice, either upwards, rightwards, leftwards, or downwards) and which compile to $C(X)_{(h,t_j)}C(X)_{(h,t_k)}$ and $C(X)_{(t_j,h)}C(X)_{(t_k,h)}$, up to overall Pauli factors. There are 8 possible MZM pairs that can be chosen for the hexon for each measurement step along with (4 MZM pairs for the selected tetron. The search space for a 4-MZM, 2-MZM, 4-MZM, 2-MZM measurement sequence with the constraint that the final 2-MZM measurement is on $i\gamma_3\gamma_4$ of the hexon is therefore over $(8\times6)\times(7\times24+1\times48)=10,368$ measurement-only sequences. For each pair of directions, j and k, there exist 64 sequences for $C(X)_{(h,t)}$, and similarly for $C(X)_{(t,h)}$. These can then be combined to form measurement-only compilations of $L_X$ and $L_Z$. This produces a list of all $L_X$ and $L_Z$ circuits obtained through optimized compilations of $C(X)_{(h,t_j)}C(X)_{(h,t_k)}$ and $C(X)_{(t_j,h)}C(X_{(t_k,h)})$. A search over all length-8 measurement sequences that alternate between 4-MZM and 2-MZM measurements has yet to be carried out; the search space in this case has is over $(48\times8)^2\times48\times9\times24\times1=1,528,823,808$ measurement-only sequences.

In order to find the most optimized one of these possible eight-measurement sequences, a cost function may be used to assign "difficulty weight"s to the specific measurement operations within each sequence. Notably, measurement difficulty is dependent upon features of the experimental setup utilized. Therefore, difficulty weights are to be selected based on the specifically-selected experimental setup. By example and without limitation, the following discussion conveys one methodology for determining and numerically representing the difficulty of a particular measurement within a given and $L_X$ and $L_z$ measurement sequence.

The difficulty of implementing an individual measurement may vary on a number of factors including, for example, the following:

Cutter gates—In the hexon architecture, measurements are performed by coupling different MZMs to quantum dots, which effectively form interference loops delineated by the paths connecting the MZMs through the hexon and the paths connecting MZMs through the dots. To select the interference paths, electrostatic depletion gates are tuned which effectively connect or disconnect different parts of the semiconductor, and define quantum dots in it. These gates, also referred to below as "cutter gates" affect the measurement difficulty in two ways: (i) the disorder in the region where the cutters are deposited may locally decrease the phase coherence of the semiconductor, and thus reduce the visibility of the measurement; and (ii) the overall length and volume of the semiconducting path may affect phase coherence and properties of the dot such as its charging energy and level spacing. In general, the measurement may be easier for smaller dots. Therefore, the length of the semiconducting region including the MZMs affects the difficulty of each measurement, and number of vertical cutter gates involved in a measurement can be used as simple placeholder for the length of the semiconducting region.

Tunnel junctions—In the-described architecture, each coupling between an MZM and the semiconductor may be carefully tuned by a depletion gate forming a tunnel junction. In contrast to cutter gates between semiconducting regions, which are generally be either fully opened or closed, it is important to tune the coupling to MZMs carefully such that its ratio with the charging energy EC is in a favorable regime where the effect on the quantum dot is quickly and reliably measurable, while not suppressing the charging energy of the dot and increasing the probability of quasiparticle poisoning. Realistically, the visibility of the signal may be reduced with each tunnel junction, and noise in the tunnel gate can affect the measurement signal. Therefore, the number of tunneling junctions involved in a measurement affects the difficult of a measurement.

Flux noise—In the exemplary architecture discussed above, the energy shift of the quantum dot may depend on the magnetic flux enclosed in the loop. Noise in the enclosed flux, either from noise in the background field or any flux lines used to tune local fields, will make the measurement more challenging. As the flux noise will depend on the enclosed area, this area represents another factor potentially affecting the difficult of a measurement.

Number of islands—In the above architecture, the difficulty of a measurement will also depend on the number N of hexons involved. This is because the measurement visibility may be affected by how well the system can be tuned to the resonant tunneling point, and also because the operations utilized in a measurement can cause errors that transfer fermions between the different hexons.

By example and without limitation, the difficulty weight of a fermionic parity measurement of 2N-MZMs M (jk; l'm'; . . . ) involving N hexons in a system implementing the above-described architecture may be represented by the following cost function:

$$\omega(M) = \omega_c^{n_c(M)} \omega_t^{n_t(M)} \omega_a^{n_a(M)} f(N) \tag{16}$$

where $n_c$ is the number of vertical cutter gates that are opened for the measurement, $n_t$ is the number of tunnelign junctions involved in the measurement, which is equal to the number of MZMs involved in the measurement (including those of coherent links), and $n_a$ is the (integer) amount of unit area enclosed by the interferometry loop delineated by the measurement. The quantities $\omega_c$, $\omega_t$, and $\omega_a$ are the difficulty weights associated with the corresponding factors described above.

Using the above cost function or similar expression, the efficiencies of each length-8 $L_X$ and $L_Z$ measurement sequence can be assessed. Notably, an encoding for a tetron/hexon can be expressed as a choice of how the physical MZMs are assigned the labels (e.g., 1, 2, . . . ), and the difficulty weights of various measurements depends upon the labeling configuration utilized. For example, starting from the top left and going counter-clockwise, the MZMs on a tetron can be labeled as (1,2,3, 4) or (1, 3, 2,4). For example, the measurement of $i\gamma_1\gamma_2$ (which is still associated to a Z operator) has a lower difficulty weight in the first encoding scheme than the second since a coherent link is required.

According to one implementation, a next step in this optimization process entails a search over all hexon labeling configurations, determining the difficult weight of each sequence (e.g., per the cost function of eq. 16 above), by recording the lowest weight $L_X$ sequence and the hexon configuration for which it is realized, and likewise for $L_z$. For each tetron labeling configuration, this gives a $C_x$ labeling, sequence, and weight and a $C_Z$ labeling, sequence and weight. Defining the tetron labeling weight to be the geometric average of its $C_Z$ and $C_Z$ weight, the best labeling configuration can be selected.

According to one implementation, this process leads to identification of an optimized labeling configuration matching that of FIG. 4, where the tetrons using the ⟨1,3, 2,4⟨ configuration, the $M_X$ hexons using the ⟨5, 2,1, 3, 4, 6⟨ and $M_X$ hexons using the ⟨1, 6, 2, 3, 4, 5⟨ configuration, with the optimized measurement sequences as shown by the exemplary $L_X$ and $L_z$ circuits 410 and 412 in FIG. 4.

As mentioned above, the exemplary $L_X$ circuit 410 and $L_Z$ circuit 412 shown in FIG. 4 represent the shortest measurement sequences that may be used to achieve the four CNOT operations of the surface code stabilizer measurement. The individual measurements of these optimized solutions involve at most two of the Majorana qubit islands—one hexon and one tetron.

Figure 5:
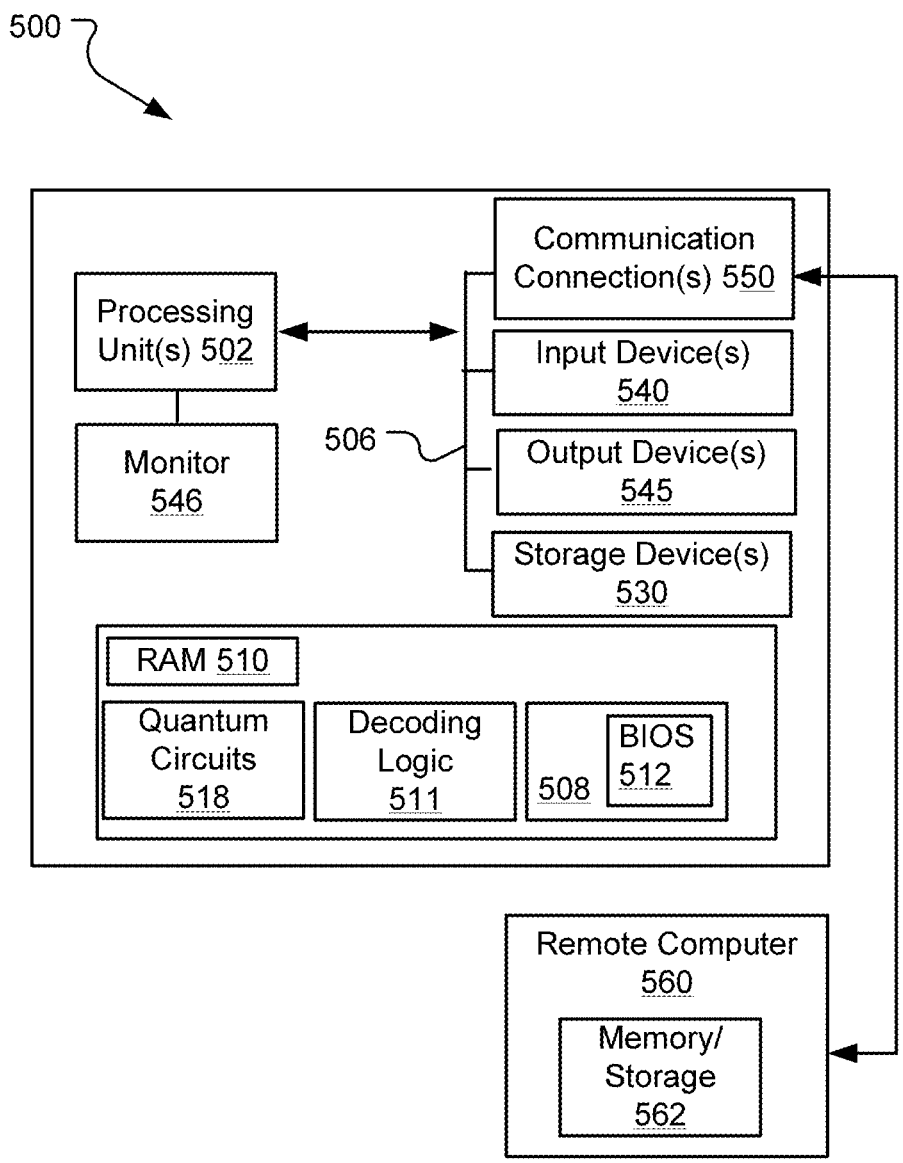
FIG. 5 and the following discussion are intended to provide a brief, general description of an exemplary computing environment in which the disclosed technology may be implemented.

FIG. 5 and the following discussion are intended to provide a brief, general description of an exemplary computing environment in which the disclosed technology may be implemented. Although not required, the disclosed technology is described in the general context of computer executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices. Typically, a classical computing environment is coupled to a quantum computing environment, but a quantum computing environment is not shown in FIG. 5. With reference to FIG. 5, an exemplary system for implementing the disclosed technology includes a general purpose computing device in the form of an exemplary conventional PC 500, including one or more processing units 502, a system memory 504, and a system bus 506 that couples various system components including the system memory 504 to the one or more processing units 502. The system bus 506 may be any of several types of bus structures including a memory bus or memory controller, a peripheral bus, and a local bus using any of a variety of bus architectures. The exemplary system memory 504 includes read only memory (ROM) 508 and random access memory (RAM) 510. A basic input/output system (BIOS) 512, containing the basic routines that help with the transfer of information between elements within the PC 500, is stored in ROM 508.

In one implementation, the system memory 504 stores control logic for a syndrome measurement circuit as well as decoding logic 511, such as QECCs and logic specifically implemented by various system decoders.

The exemplary PC 500 further includes one or more storage devices 530 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 506 by a hard disk drive interface, a magnetic disk drive interface, and an optical drive interface, respectively. The drives and their associated computer readable media provide nonvolatile storage of computer-readable instructions, data structures, program modules, and other data for the PC 500. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 530 including an operating system, one or more application programs, other program modules, and program data. Decoding logic can be stored in the storage devices 530 as well as or in addition to the memory 504. A user may enter commands and information into the PC 500 through one or more input devices 540 such as a keyboard and a pointing device such as a mouse. Other input devices may include a digital camera, microphone, joystick, game pad, satellite dish, scanner, or the like. These and other input devices are often connected to the one or more processing units 502 through a serial port interface that is coupled to the system bus 506, but may be connected by other interfaces such as a parallel port, game port, or universal serial bus (USB). A monitor 546 or other type of display device is also connected to the system bus 506 via an interface, such as a video adapter. Other peripheral output devices 545, such as speakers and printers (not shown), may be included.

The PC 500 may operate in a networked environment using logical connections to one or more remote computers, such as a remote computer 560. In some examples, one or more network or communication connections 550 are included. The remote computer 560 may be another PC, a server, a router, a network PC, or a peer device or other common network node, and typically includes many or all of the elements described above relative to the PC 500, although only a memory storage device 562 has been illustrated in FIG. 5. The personal computer 500 and/or the remote computer 560 can be connected to a logical a local area network (LAN) and a wide area network (WAN). Such networking environments are commonplace in offices, enterprise wide computer networks, intranets, and the Internet.

When used in a LAN networking environment, the PC 500 is connected to the LAN through a network interface. When used in a WAN networking environment, the PC 500 typically includes a modem or other means for establishing communications over the WAN, such as the Internet. In a networked environment, program modules depicted relative to the personal computer 500, or portions thereof, may be stored in the remote memory storage device or other locations on the LAN or WAN. The network connections shown are exemplary, and other means of establishing a communications link between the computers may be used.

An example quantum device disclosed herein includes a syndrome measurement circuit implementing an error correction code using a plurality of Majorana qubit islands. The syndrome measurement circuit is adapted to effect a syndrome measurement by performing a sequence of measurement-only operations where each one of the measurement-only operations involves at most two of the Majorana qubit islands.

In one example quantum device of any preceding device, each of the Majorana qubit islands is either a *Majorana tetron* or a *Majorana hexon*.

In another example quantum device of any preceding quantum device, the plurality of Majorana qubit islands are arranged in a regular array.

In still another example quantum device of any preceding quantum device, the error correction code is a surface code.

In yet another example quantum device of any preceding quantum device, the Majorana qubit islands include tetrons representing data qubits and hexons representing ancillary qubits.

In still another example quantum device of any preceding device, the syndrome measurement includes multiple stabilizer measurements, each of the stabilizer measurements being implemented by a sequence of joint fermionic parity measurements.

In yet still another example quantum device of any preceding quantum device, each measurement in the sequence of joint fermionic parity measurements measures either two Majorana zero modes or four Majorana zero modes.

In another example quantum device of any preceding device, the sequence of joint fermionic parity measurements is optimized with respect to a measurement resource cost function.

In yet another example quantum device of any preceding device, each of the stabilizer measurements is effected by a sequence of eleven joint fermionic parity measurements. Seven of the eleven fermionic parity measurements involve two Majorana zero modes and four of the eleven fermionic parity measurements involve four Majorana zero modes.

An example method disclosed herein provides for implementing a syndrome measurement for an error correction code through measurement-only operations by performing sequences of measurement-only operations on a plurality of Majorana qubit islands. Each one of the measurement-only operations involves at most two of the Majorana qubit islands.

In an example method according to any preceding method, each of the Majorana qubit islands is either a *Majorana tetron* or a *Majorana hexon*.

In yet another example method of any preceding method, the plurality of Majorana qubit islands are arranged in a regular array.

In still another example method of any preceding method, wherein the error correction code is a surface code.

In still another example method of any preceding method, the Majorana qubit islands include tetrons representing data qubits and hexons representing ancillary qubits.

In yet another example method of any preceding method, implementing the syndrome measurement further comprises performing a stabilizer measurement with respect to each of multiple plaquettes in a surface code, the stabilizer measurement being implemented by a sequence of joint fermionic parity measurements.

In another example method of any preceding method, each measurement in the sequence of joint fermionic parity measurements measures either two Majorana zero modes or four Majorana zero modes.

In still another example method of any preceding method, the sequence of joint fermionic parity measurements is optimized with respect to a measurement resource cost function.

In another example method of any preceding method, the stabilizer measurement is implemented by a measurement sequence consisting of eleven joint fermionic parity measurements. Seven of the eleven fermionic parity measurements involve two Majorana zero modes and four of the eleven fermionic parity measurements involve four Majorana zero modes.

An example system disclosed herein includes a means for implementing a syndrome measurement for an error correction code through measurement-only operations by performing sequences of measurement-only operations on a plurality of Majorana qubit islands. Each one of the measurement-only operations involves at most two of the Majorana qubit islands.

Another example quantum device disclosed herein includes a syndrome measurement circuit implementing a syndrome measurement of an error correction code by performing a sequence of measurement-only operations on hexons and tetrons in an array of Majorana qubit islands.

In another example quantum device of any preceding device, each measurement in the sequence of measurement-only operations involves at most two islands in the array of Majorana qubit islands.

The above specification, examples, and data together with attached Appendix A provide a complete description of the structure and use of exemplary implementations. Since many implementations can be made without departing from the spirit and scope of the claimed invention, the claims hereinafter appended define the invention. Furthermore, structural features of the different examples may be combined in yet another implementation without departing from the recited claims. The above specification, examples, and data provide a complete description of the structure and use of exemplary implementations. Since many implementations can be made without departing from the spirit and scope of the claimed invention, the claims hereinafter appended define the invention. Furthermore, structural features of the different examples may be combined in yet another implementation without departing from the recited claims.

What is claimed is:

1. A quantum device comprising:
   a syndrome measurement circuit implementing an error correction code using a plurality of Majorana qubit islands, the syndrome measurement circuit being adapted to effect a syndrome measurement by performing measurement-only operations, each one of the multiple stabilizer measurements being implemented by a sequence of joint fermionic parity measurements, each of the joint fermionic parity measurements involving at most two of the Majorana qubit islands.

2. The quantum device of claim 1, wherein each of the Majorana qubit islands is either a Majorana tetron or a Majorana hexon.

3. The quantum device of claim 1, wherein the plurality of Majorana qubit islands are arranged in a regular array.

4. The quantum device of claim 1, wherein the error correction code is a surface code.

5. The quantum device of claim 1, wherein the Majorana qubit islands include tetrons representing data qubits and hexons representing ancillary qubits.

6. The quantum device of claim 1, wherein each measurement in the sequence of joint fermionic parity measurements measures either two Majorana zero modes or four Majorana zero modes.

7. The quantum device of claim 1, wherein the sequence of joint fermionic parity measurements is optimized with respect to a measurement resource cost function.

8. The quantum device of claim 1, wherein each of the stabilizer measurements is effected by a sequence of eleven joint fermionic parity measurements, wherein seven of the eleven fermionic parity measurements involve two Majorana zero modes and four of the eleven fermionic parity measurements involve four Majorana zero modes.

9. A method comprising:
    implementing a syndrome measurement for an error correction code by performing a sequence of stabilizer measurements, each of the stabilizer measurements being implemented by a sequence of joint fermionic parity measurements effected through measurement-only operations on a plurality of Majorana qubit islands, each one of the measurement-only operations involving at most two of the Majorana qubit islands.

10. The method of claim 9, wherein each of the Majorana qubit islands is either a Majorana tetron or a Majorana hexon.

11. The method of claim 9, wherein the plurality of Majorana qubit islands are arranged in a regular array.

12. The method of claim 9, wherein the error correction code is a surface code.

13. The method of claim 9, wherein the Majorana qubit islands include tetrons representing data qubits and hexons representing ancillary qubits.

14. The method of claim 9, wherein implementing the syndrome measurement further comprises:
    performing a stabilizer measurement with respect to each of multiple plaquettes in a surface code.

15. The method of claim 14, wherein each measurement in the sequence of joint fermionic parity measurements measures either two Majorana zero modes or four Majorana zero modes.

16. The method of claim 14, wherein the sequence of joint fermionic parity measurements is optimized with respect to a measurement resource cost function.

17. The method of claim 14, wherein the stabilizer measurement is implemented by a measurement sequence consisting of eleven joint fermionic parity measurements, wherein seven of the eleven fermionic parity measurements involve two Majorana zero modes and four of the eleven fermionic parity measurements involve four Majorana zero modes.

18. A quantum device comprising:
    a syndrome measurement circuit implementing a syndrome measurement of an error correction code by performing a sequence of measurement-only operations on hexons and tetrons in an array of Majorana qubit islands, wherein the Majorana qubit islands include tetrons representing data qubits and hexons representing ancillary qubits.

19. The quantum device of claim 18, wherein each measurement in the sequence of measurement-only operations involves at most two islands in the array of Majorana qubit islands.

* * * * *